(12) United States Patent
Lv

(10) Patent No.: US 11,054,677 B2
(45) Date of Patent: Jul. 6, 2021

(54) METHOD OF EXAMINING RELIABILITY OF A GATE DRIVER ON ARRAY (GOA) CIRCUIT AND SYSTEM THEREOF

(71) Applicant: HUIZHOU CHINA STAR OPTOELECTRONICS TECHNOLOGY CO., LTD., Huizhou (CN)

(72) Inventor: Chengling Lv, Huizhou (CN)

(73) Assignee: HUIZHOU CHINA STAR OPTOELECTRONICS TECHNOLOGY CO., LTD., Huizhou (CN)

( * ) Notice: Subject to any disclaimer, the term of this patent is extended or adjusted under 35 U.S.C. 154(b) by 509 days.

(21) Appl. No.: 15/759,018

(22) PCT Filed: Feb. 12, 2018

(86) PCT No.: PCT/CN2018/076397
§ 371 (c)(1),
(2) Date: Mar. 9, 2018

(87) PCT Pub. No.: WO2019/144450
PCT Pub. Date: Aug. 1, 2019

(65) Prior Publication Data
US 2020/0225515 A1    Jul. 16, 2020

(30) Foreign Application Priority Data

Jan. 26, 2018 (CN) .......................... 201810076755.8

(51) Int. Cl.
*G02F 1/13* (2006.01)
*G01R 31/28* (2006.01)
*G09G 3/34* (2006.01)

(52) U.S. Cl.
CPC ....... *G02F 1/1309* (2013.01); *G01R 31/2825* (2013.01); *G09G 3/3406* (2013.01); *G09G 2320/041* (2013.01)

(58) Field of Classification Search
None
See application file for complete search history.

(56) References Cited

U.S. PATENT DOCUMENTS

2009/0184914 A1   7/2009   Han
2012/0306520 A1   12/2012  Liao
(Continued)

FOREIGN PATENT DOCUMENTS

CN   101825813 A   9/2010
CN   201716396 U   1/2011
(Continued)

OTHER PUBLICATIONS

Translation of CN 203260300 U (Year: 2013).*
Translation of CN 101825813 A (Year: 2010).*
Translation of CN 107093411 A (Year: 2017).*

*Primary Examiner* — Jermele M Hollington

(57) ABSTRACT

A method of examining reliability of a gate driver on array (GOA) circuit and a system thereof are provided. The method includes matching a liquid crystal panel with a direct-lit backlight/an edge-lit backlight to form a liquid crystal display module; disposing a heater on a position of the liquid crystal panel upper surface corresponding to a GOA circuit region; implementing a reliability test to the liquid crystal display module, wherein the heater heats the liquid crystal panel to a predetermined temperature; and observing a screen situation of the liquid crystal panel to examine an effect of temperature on the reliability of the GOA circuit.

2 Claims, 4 Drawing Sheets

(56) References Cited

U.S. PATENT DOCUMENTS

2019/0272795 A1     9/2019  Xu
2019/0383993 A1*   12/2019  Lv .................... G02F 1/133385

FOREIGN PATENT DOCUMENTS

| CN | 102213737 | A | 10/2011 |
| CN | 203260300 | U | 10/2013 |
| CN | 206339803 | U |  7/2017 |
| CN | 107093411 | A |  8/2017 |
| CN | 107316595 | A | 11/2017 |

* cited by examiner

METHOD OF EXAMINING RELIABILITY OF A GATE DRIVER ON ARRAY (GOA) CIRCUIT AND SYSTEM THEREOF

FIELD OF INVENTION

The present invention relates to display panel manufacturing fields, especially to a method of examining reliability of reliability of a gate driver on array (GOA) and system thereof.

BACKGROUND OF INVENTION

Gate driver on Array (GOA) is technology that directly disposes a gate electrode driver circuit (gate driver ICs) on an array substrate (array) as a substitute for an external driver IC. Compared to conventional liquid crystal panels, when the GOA works, a circuit on a thin film transistor (TFT) substrate heats and results in increase of temperature of a distributing region of the GOA circuit. Once under high temperature, there is a risk of the GOA circuit will be unable to function.

On the other hand, GOA display panels undergo OC reliability verifications with corresponding backlights before shipping. At present, display panel manufacturers mainly purchase direct-lit backlights because there are not many small-batch backlights available for reliability (RA) tests in the market, especially for larger sized backlight where selectivity is smaller, and generally direct-lit backlights meet such requirement. In other words, the purchased backlights are not necessarily the backlights of the customers. For example, a manufacturer employs direct-lit backlights to verify RA while a customer of machine factory employs edge-lit backlights. Temperature of the direct-lit backlight is distributed evenly, and temperature in a GOA region is low. However, an edge-lit backlight easily forms an obvious temperature gradient in the GOA region, especially when a light source is underneath the GOA region (double short edges light source entering). Therefore, conventional factory RA tests cannot fully reflect the influence of the temperature generated by the direct-lit and edge-lit backlight on normal operation of the GOA circuit. When the screen exhibits abnormalities, high temperature concerns of the abnormal circuit will be of first concern because information about influence of heat generated from the backlight of a customer (especially the edge-lit backlight) on the GOA circuit under the RA condition is unavailable. Therefore, the usual practice is that when an issue occurs, related experiments are implemented first for investigation of influence of the temperature on work of the GOA circuit, which would waste manpower and resources.

SUMMARY OF INVENTION

The present invention provides a method of examining reliability of a GOA circuit and a system thereof that can feed temperature effect of an edge-lit backlight on the GOA circuit back to a direct-lit backlight without limitation of the backlight architecture, and both can examine the effect of the temperature on the reliability of the GOA circuit under the reliability test condition.

To solve the above issue, the present invention provides technical solutions as follows:

The present invention provides a method of examining reliability of a GOA circuit, the method includes steps as follows:

step S1, providing a liquid crystal panel, and matching the liquid crystal panel with a direct-lit backlight/an edge-lit backlight to form a liquid crystal display module;

step S2, disposing a heater on at least one edge of an edge region of an upper surface of the liquid crystal panel, wherein the heater extends along the liquid crystal panel to a position corresponding to a GOA circuit region;

step S3, implementing a reliability test to the liquid crystal display module, heating the liquid crystal panel by the heater to a predetermined temperature, wherein a temperature of the heater is evenly distributed or distributed gradiently; and step S4, observing a screen situation of the liquid crystal panel, and when the screen situation is not abnormal under the reliability test, excluding an effect of the temperature on the reliability of the GOA circuit.

According to a preferred embodiment of the present invention, the heater is disposed on the edge region corresponding to at least one of two short edges of the liquid crystal panel, and corresponds to a black array region of the liquid crystal panel.

According to a preferred embodiment of the present invention, the heater covers the GOA circuit region.

According to a preferred embodiment of the present invention, a width of the heater is 5 mm to 20 mm.

According to a preferred embodiment of the present invention, a thickness of the heater is 0.05 mm to 0.5 mm.

According to a preferred embodiment of the present invention, during the reliability test, the temperature of the heater is less than 75° C.

The present invention also provides a system of examining reliability (RA) of a gate driver on array (GOA) circuit, and the system includes:

a chamber temperature-control unit, configured to control a temperature of a RA test chamber of the liquid crystal display module;

the liquid crystal display module including a liquid crystal panel and a direct-lit backlight/an edge-lit backlight;

a heater temperature-control unit configured to control a temperature of a heater of a GOA circuit region of the liquid crystal panel;

a monitoring unit configured to examine an effect of the temperature on the reliability of the GOA circuit under a RA test condition, and configured to monitor a screen situation of the liquid crystal panel;

an alarm unit configured to send out an alert when the monitoring unit monitors and detects abnormality of the screen situation of the liquid crystal panel; and the system further including a display unit configured to display data information of the monitoring unit.

According to a preferred embodiment of the present invention, during the reliability test, a temperature of the heater temperature-control unit is set as a sum of an environment temperature, a temperature difference between the liquid crystal panel with the direct-lit and the liquid crystal panel with the edge-lit backlight and an allowance temperature difference, and is less than 75° C.

The present invention also provides a method of examining reliability of a GOA circuit, and the method includes steps as follows:

step S1, providing a liquid crystal panel, matching the liquid crystal panel with a direct-lit backlight/an edge-lit backlight to form a liquid crystal display module;

step S2, disposing a heater on at least one edge of an edge region of an upper surface of the liquid crystal panel, wherein the heater extends along the liquid crystal panel to a position corresponding to a GOA circuit region;

step S3, implementing a reliability test to the liquid crystal display module, heating the liquid crystal panel by the heater to a predetermined temperature; and step S4, observing a screen situation of the liquid crystal panel, and when the screen situation is not abnormal under the reliability test, excluding an effect of the temperature on the reliability of the GOA circuit.

According to a preferred embodiment of the present invention, the heater is disposed on the edge region corresponding to at least one of two short edges of the liquid crystal panel, and corresponds to a black array region of the liquid crystal panel.

According to a preferred embodiment of the present invention, the heater covers the GOA circuit region.

According to a preferred embodiment of the present invention, a width of the heater is 5 mm to 20 mm.

According to a preferred embodiment of the present invention, a thickness of the heater is 0.05 mm to 0.5 mm.

According to a preferred embodiment of the present invention, during the reliability test, a temperature of the heater is less than 75° C.

Advantageous effects of the present invention are as follows: Compared to a conventional liquid crystal panel reliability test, the method of examining the reliability of the GOA circuit and the system thereof provided by the present invention, by disposing the and the corresponding temperature-control system on the liquid crystal display module, during the reliability test, can feed the temperature effect of the edge-lit backlight on the GOA circuit back to the direct-lit backlight without limitation of the backlight architecture (both direct-lit and edge-lit backlights), and both can evaluate the effect of the temperature on the reliability of the GOA circuit under the reliability (RA) test condition. Also, the method may be applied to a test under a non-RA condition simply by setting a corresponding heating temperature, which saves manpower and resources and improves work efficiency.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
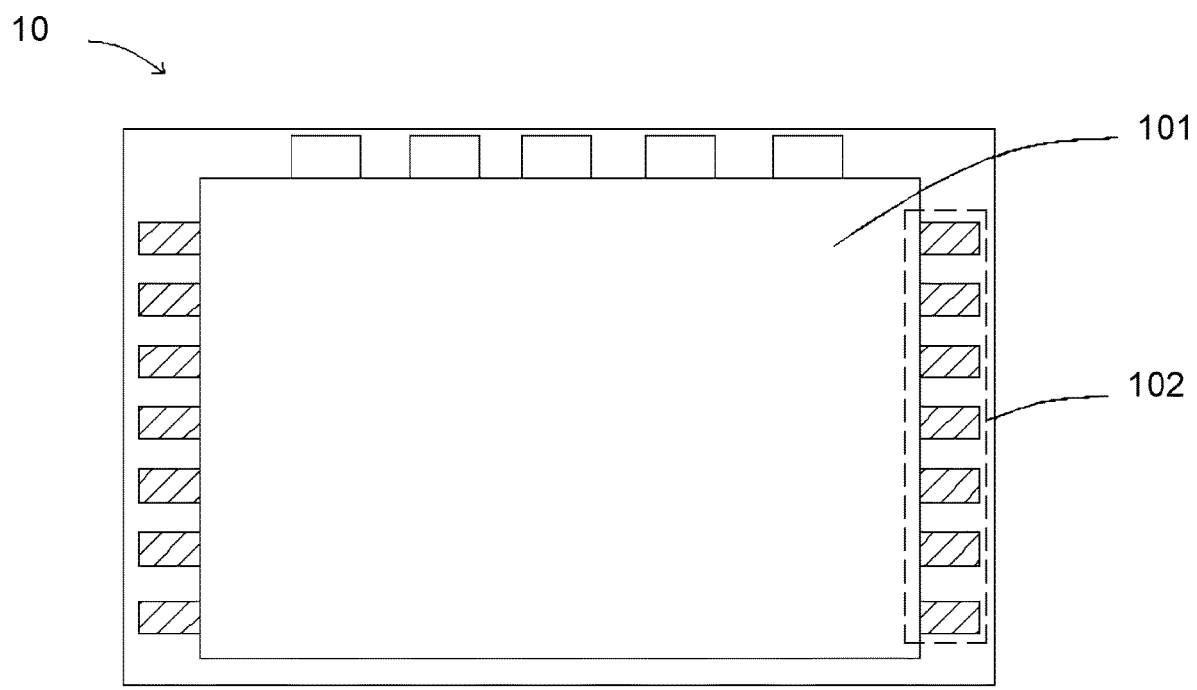
FIG. 1 is a structural schematic view of a conventional liquid crystal panel in accordance with the prior art.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface" and etc., only refer to the directions of the appended figures. Therefore, the terminologies of direction are used for explanation and comprehension of the present invention, instead of limiting the present invention. In the figures, units with similar structures are marked with the same reference numerals.

The present invention aims to the technical issue that a conventional liquid crystal panel reliability (RA) test cannot fully reflect the influence of the temperature generated by the direct-lit and edge-lit backlight on the normal operation of the gate driver on array (GOA) circuit such that manpower and resources are wasted. The present embodiment is able to solve the above issue.

With reference to FIG. 1 that is a structural schematic view of a conventional liquid crystal panel in accordance with the prior art, a liquid crystal panel 10 includes a display region 101 and a GOA circuit region 102, the GOA circuit region 102 is located on a periphery of the display region 101 and is disposed on a short edge of the liquid crystal panel 10. Before being shipped out, the liquid crystal panel 10 is always with a corresponding backlight to undergo OC reliability verification. The backlights, according to methods of light source entering, are classified into direct-lit backlights and edge-lit backlights. Furthermore, the edge-lit backlights include double long edges light source entering, single long edge light source entering, double short edges light source entering, single short edge light source entering, etc. However, backlights available for RA tests in the market are generally direct-lit backlights.

Figure 2:
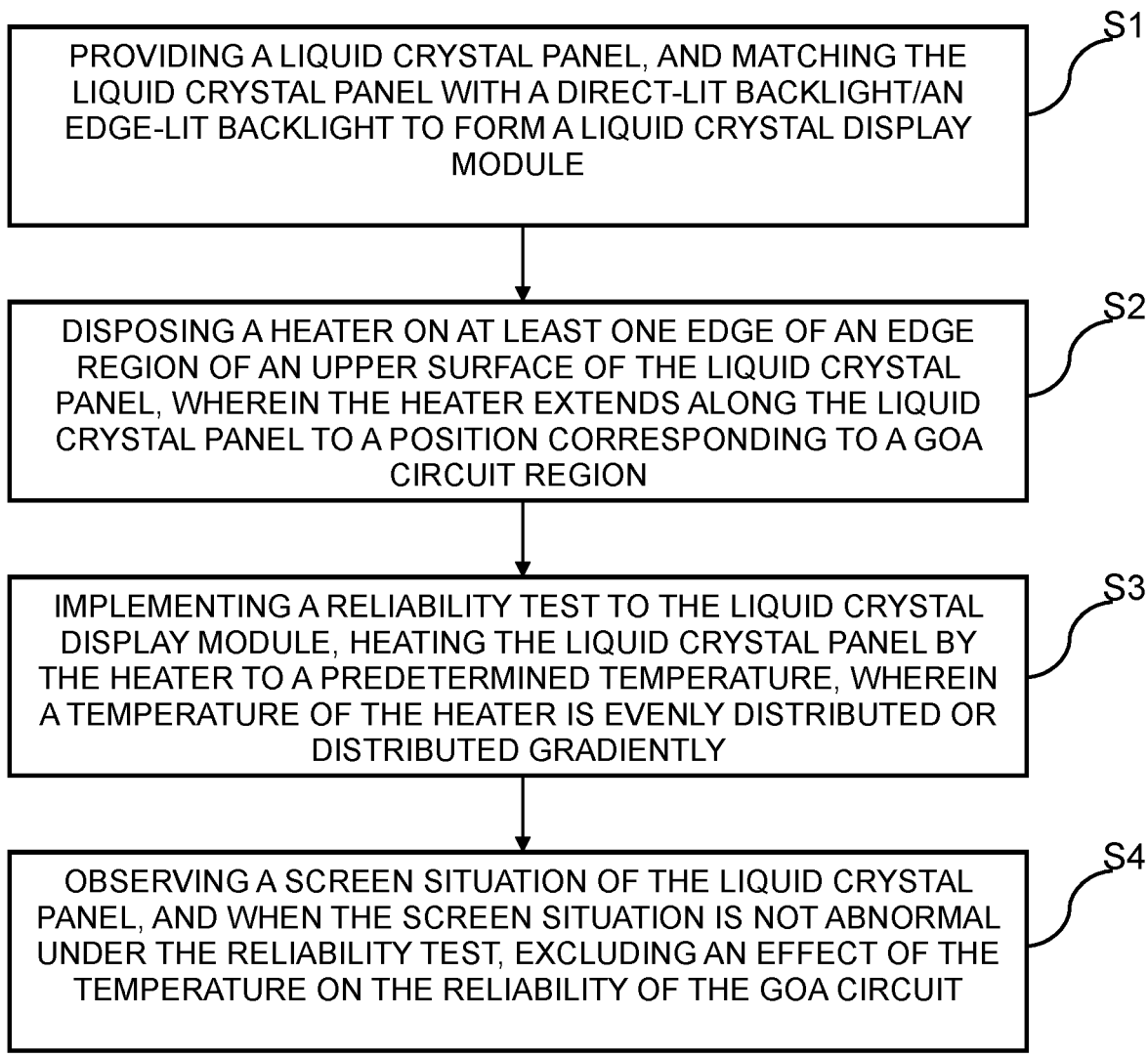
FIG. 2 is a flowchart of a method of examining reliability of a gate driver on array (GOA) circuit in accordance with the present invention.

The present invention provides a method of examining reliability of a GOA circuit, as shown in FIG. 2, the method includes steps as follows:

step S1, providing a liquid crystal panel, and matching the liquid crystal panel with a direct-lit backlight/an edge-lit backlight to form a liquid crystal display module;

step S2, disposing a heater on at least one edge of an edge region of an upper surface of the liquid crystal panel, wherein the heater extends along the liquid crystal panel to a position corresponding to a GOA circuit region;

step S3, implementing a reliability test to the liquid crystal display module, heating the liquid crystal panel by the heater to a predetermined temperature, wherein a temperature of the heater is evenly distributed or distributed gradiently; and step S4, observing a screen situation of the liquid crystal panel, and when the screen situation is not abnormal under the reliability test, excluding an effect of the temperature on the reliability of the GOA circuit.

Figure 3:
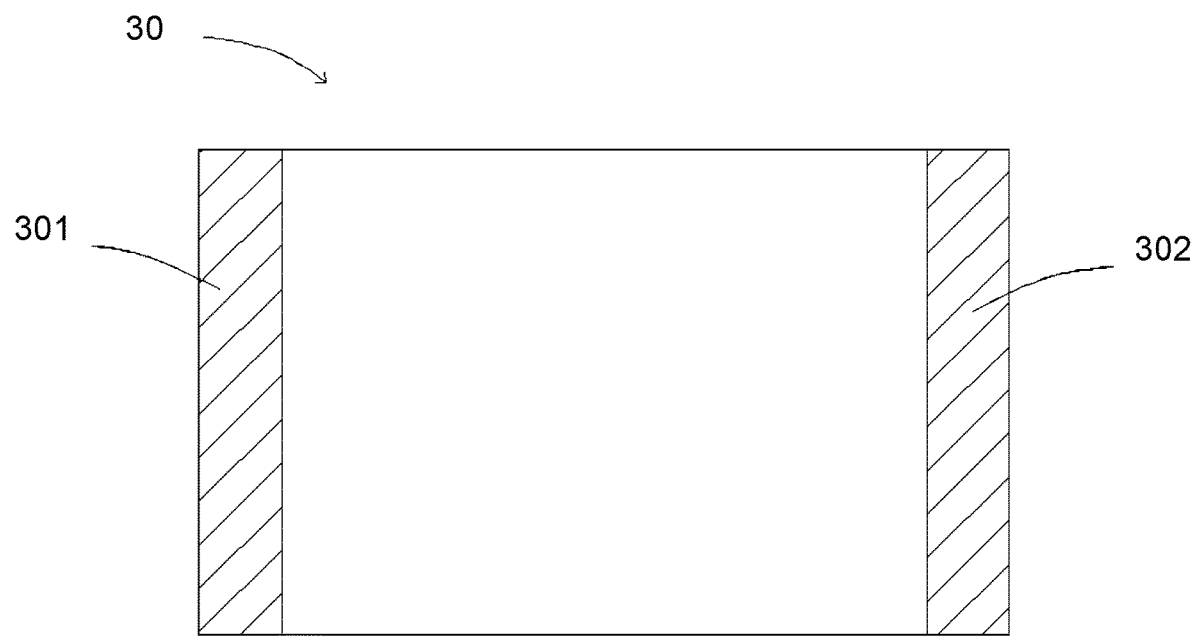
FIG. 3 is a structural schematic view of a liquid crystal panel configured to match with a double short edges edge-lit backlight provided by a first embodiment of the present invention.

Specifically, with reference to FIG. 3 that is a structural schematic view of a liquid crystal panel configured to match with a double short edges edge-lit backlight provided by a first embodiment of the present invention. The liquid crystal panel 30 matches the direct-lit backlight to form a liquid crystal display module. Two heathers are disposed on the edge region respectively corresponding to two short edges of an upper surface of the liquid crystal panel 30, and are center-symmetrical to each other. The heaters are preferably a first heating sheet plate 301 and a second heating sheet plate 302. The liquid crystal panel 30 includes a display region and a non-display region. The first heating sheet plate 301 and the second heating sheet plate 302 are located in the non-display region, and correspond to a black array region of the liquid crystal panel 30. A GOA circuit region is disposed on a short edge in the periphery of the display region corresponding to the liquid crystal panel 30 (as shown in FIG. 1). The first heating sheet plate 301 and the second heating sheet plate 302 cover the GOA circuit region of the liquid crystal panel 30.

A width of each of the first heating sheet plate 301 and the second heating sheet plate 302 is 5 mm to 20 mm, a thickness thereof is 0.05 mm to 0.5 mm. Preferably, the width is 10 mm, and the thickness is 0.1 mm to 0.25 mm.

Taking the high temperature operation of RA at 50° C./80 RH for example, to implement a RA test to the liquid crystal display module, the first heating sheet plate 301 and the second heating sheet plate 302 heat the liquid crystal panel 30 to a predetermined temperature. The predetermined temperature is a sum of an environment temperature, a temperature difference between the liquid crystal panel with the direct-lit and the liquid crystal panel with the edge-lit backlight and an allowance temperature difference. The environment temperature is a chamber temperature of the RA test process, and is 50° C. in the present embodiment. After consideration of the severest situation (double short edges edge-lit backlight) and through actual measurement, simulation data and indication of past theoretical experience, a temperature difference between the liquid crystal panel employing the direct-lit backlight and the liquid crystal panel employing the double short edges edge-lit backlight is about 10° C. Therefore, under strict consideration, a heating temperature of the first heating sheet plate 301 and the second heating sheet plate 302 is set about 72° C. (RA testing temperature 50° C.+temperature difference 10° C.+allowance 1-2° C.=72° C.). Furthermore, the heating temperature is less than 75° C. because such value is close to an upper limit of the temperature for normal work of liquid crystals.

The screen situation of the liquid crystal panel 30 is observed, an effect of the temperature on the reliability of the GOA circuit is examined under the RA test condition. If the screen situation is not abnormal, the effect of the temperature will be excluded when the liquid crystal panel 30 later matching a customer's edge-lit backlight has bad situation such as abnormal screens (issue), etc. During the RA test, if the screen situation is abnormal, a further clarification whether such abnormality is related to the temperature will be needed before the liquid crystal panel is delivered to the customer.

It is understood that when the liquid crystal panel 30 is configured to match a single short edge edge-lit backlight, a surface of the liquid crystal panel 30 is configured to be disposed with one of the first heating sheet plate 301/the second heating sheet plate 302 that is disposed on a side of a light source and covers the GOA circuit region. During the RA test, the backlight configured to match the liquid crystal panel 30 may select an edge-lit backlight. The type of the backlight selected and used in the present invention is not limited.

A parameter of the temperature of the heater may be a gradient design simulating actual temperature distribution of the GOA circuit region such that a more accurate examination may be achieved. A specific design of the temperature gradient may be set according to actual situation.

The liquid crystal panel of the embodiment of in the present invention may be configured to match a four edges edge-lit backlight, U-shaped edge-lit backlight or L-shaped edge-lit backlight of customers, etc. Similar to the first embodiment, a heater is disposed on a corresponding position of a surface of the liquid crystal panel corresponding to the GOA circuit region, and is configured to examine the effect of the temperature on the reliability of the GOA circuit in the RA test or other test.

Figure 4:
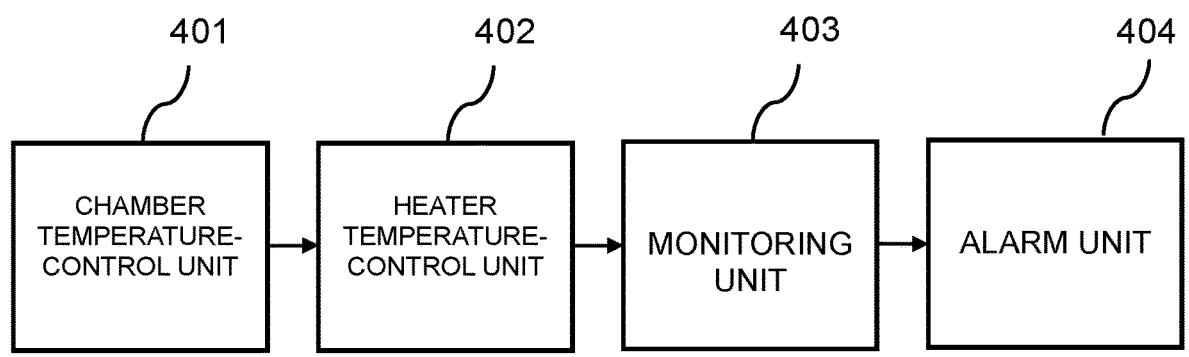
FIG. 4 is a schematic view of a system of examining the reliability of the GOA circuit in accordance with the present invention.

The present invention also provides a for system examining the reliability of the GOA circuit. With reference to FIG. 4, the system includes: a chamber temperature-control unit 401, a heater temperature-control unit 402, a monitoring unit 403, and an alarm unit 404.

The chamber temperature-control unit 401 is configured to control a temperature of a RA test chamber of a liquid crystal display module. the liquid crystal display module includes a liquid crystal panel and a corresponding direct-lit backlight/edge-lit backlight configured to the RA test. The temperature of the chamber temperature-control unit 401 is set according to different types of examination tests.

The heater temperature-control unit 402 is configured to control a temperature of a heater of a GOA circuit region of the liquid crystal panel. The temperature of the heater temperature-control unit 402 is set according to the temperature of the chamber temperature-control unit 401, and then is combined with a temperature difference between the liquid crystal panel employing the direct-lit backlight and liquid crystal panel employing the edge-lit backlight and allowance temperature difference to be set further.

The monitoring unit 403, monitors GOA working signals under the RA test condition, is configured to examine an effect of the temperature on the reliability of the GOA circuit, and is configured to monitor a screen situation of the liquid crystal panel.

The alarm unit 404 is configured to send out an alert when the monitoring unit monitors and detects abnormality of the screen situation of the liquid crystal panel. If the screen situation is not abnormal, the effect of the temperature will be excluded when the liquid crystal panel 30 later matching a customer's edge-lit backlight has bad situation such as abnormal screens (issue), etc. During the RA test, if the screen situation is abnormal, a further clarification whether such abnormality is related to the temperature will be needed before the liquid crystal panel is delivered to the customer.

The system further includes a display unit configured to display data information of the monitoring unit 403. During the RA test, a temperature of the heater temperature-control unit 402 is set as a sum of an environment temperature, a temperature difference between the liquid crystal panel with the direct-lit and the liquid crystal panel with the edge-lit backlight and an allowance temperature difference, and is less than 75° C.

Compared to a conventional liquid crystal panel reliability test, the method of examining the reliability of the GOA circuit and the system thereof provided by the present invention, by disposing the and the corresponding temperature-control system on the liquid crystal display module, during the reliability test, can feed the temperature effect of the edge-lit backlight on the GOA circuit back to the direct-lit backlight without limitation of the backlight architecture (both direct-lit and edge-lit backlights), and both can evaluate the effect of the temperature on the reliability of the GOA circuit under the reliability (RA) test condition. Also, the method may be applied to a test under a non-RA condition simply by setting a corresponding heating temperature, which saves manpower and resources and improves work efficiency.

Although the preferred embodiments of the present invention have been disclosed as above, the aforementioned preferred embodiments are not used to limit the present invention. The person of ordinary skill in the art may make various of changes and modifications without departing from the spirit and scope of the present invention. Therefore, the scope of protection of the present invention is defined by the scope of the claims.

What is claimed is:

1. A system of examining reliability of a gate driver on array (GOA) circuit, wherein the system comprises:
- a chamber temperature-control unit configured to control a temperature of a reliability test chamber of a liquid crystal display module;
- the liquid crystal display module comprising a liquid crystal panel and a direct-lit backlight/an edge-lit backlight;
- a heater temperature-control unit configured to control a temperature of a heater of a gate driver on array (GOA) circuit region of the liquid crystal panel, wherein the heater is configured to heat the liquid crystal panel;
- a monitoring unit configured to examine effect of the temperature on the reliability of the GOA circuit under a condition of a reliability test, and configured to monitor a screen situation of the liquid crystal panel;
- an alarm unit configured to send out an alert when the monitoring unit monitors and detects abnormality of the screen situation of the liquid crystal panel; and
- the system further comprising a display unit configured to display data information of the monitoring unit.

2. The system as claimed in claim 1, wherein during the reliability test, a temperature of the heater temperature-control unit is set as a sum of an environment temperature, a temperature difference between the liquid crystal panel with the direct-lit backlight and the liquid crystal panel with the edge-lit backlight, and an allowance temperature difference, and is less than 75° C.

* * * * *